United States Patent [19]

Held

[11] 3,854,950

[45] Dec. 17, 1974

[54] HALATION PROTECTION FOR MULTILAYER IMAGING OF PHOTOPOLYMERS

[75] Inventor: Robert Paul Held, Englishtown, N.J.

[73] Assignee: E. I. du Pont de Nemours and Company, Wilmington, Del.

[22] Filed: June 9, 1972

[21] Appl. No.: 261,204

[52] U.S. Cl. .......................... 96/82, 96/15, 96/48 R, 96/84 UV, 96/115 R, 96/115 P

[51] Int. Cl. ...... G03c 1/92, G03c 7/16, G03c 5/24, G03c 1/84, G03c 1/68

[58] Field of Search ... 96/115 P, 84 UV, 82, 115 R, 96/91 N

[56] References Cited

UNITED STATES PATENTS

| | | | |
|---|---|---|---|
| 3,617,287 | 11/1971 | Jeffers | 96/115 P |
| 2,948,611 | 8/1960 | Barney | 96/35 |
| 3,036,916 | 5/1962 | Notley | 96/84 R |
| 2,902,365 | 9/1959 | Martin | 96/115 P |
| 3,099,558 | 7/1963 | Levinos | 96/115 P |
| 3,202,513 | 8/1965 | Thommes | 96/115 P |
| 3,479,185 | 11/1969 | Chambers | 96/115 P |
| 3,649,268 | 3/1972 | Chu et al. | 96/115 P |

*Primary Examiner*—David Klein
*Assistant Examiner*—Richard L. Schilling

[57] ABSTRACT

Clear and colorless photohardenable compositions and elements are described which are protected against halation effects by incorporating into the photohardenable composition substantial amounts of ultraviolet absorbing materials. The amount of ultraviolet absorber used reduces the normally transmitted actinic radiation of photohardenable layers by at least 50%. The ultraviolet absorbers many themselves be optical brighteners or may be used in combination with an optical brightener if necessary. Such photohardenable elements are useful in preparing sharp, bright, multicolor images with clean white backgrounds on toning with colorants.

19 Claims, No Drawings

HALATION PROTECTION FOR MULTILAYER IMAGING OF PHOTOPOLYMERS

BACKGROUND OF THE INVENTION

1. Field of the Invention

This invention relates to image reproduction systems that employ a photohardenable material, including photopolymerizable material, to modulate adherence of image readout material to the imaging layer. More particularly this invention relates to image reproduction systems that employ a photohardenable material which is substantially clear and colorless and which is protected from halation effects.

2. Description of the Prior Art

Prior art describes image reproduction systems and processes that employ photohardenable material to produce a multicolored image. In assignee's patent Chu et al., U.S. Pat. No. 3,649,268, such an image reproduction process is described in which an element having a removable support and a photohardenable layer is laminated to a suitable receptor, imagewise exposed through the support to actinic radiation, the support stripped from the layer, and the outer surface dusted with colored material which adheres only to the underexposed areas of the layer to read-out the image. By repeating the laminating, exposing with separate color separation records, stripping, and dusting steps in sequence, a multicolor image is obtained.

Some photohardenable materials, although substantially clear, have an inherent yellow tint which is undesirable when the above mentioned process is used, for example, to prepare color proofs. Prior art describes the use of "optical brighteners" or "optical whiteners" to avoid similar undesirable coloration in polymers. Fluorescent compounds are added to produce a whiter and/or brighter material. See Gurney, U.S. Pat. No. 3,644,394; Keller, U.S. Pat. No. 2,784,183; and Scalera, U.S. Pat. No. 2,563,493. For brighteners or whiteners to be useful in a photohardenable material they should not adversely affect the photohardenable material. The assignee's aforementioned patent discloses the use of small amounts, i.e., about 0.2%, of a whitener in a photohardenable layer.

In imaging processes, such as the one described above, where a sequence of imaged layers is built up, absorption or reflection of actinic radiation by previously imaged layers can produce detrimental effects in the top most photohardenable layer upon imaging exposure. Prior art describes the use of an antihalation layer used below a photohardenable layer or compounds (frequently dyes) used within the photohardenable layer which absorb actinic radiation to prevent halation effects. In spectral regions where a photoinitiator strongly absorbs actinic radiation, the photoinitiator itself functions as an antihalation agent as, for example, in assignee's patent Jeffers, U.S. Pat. No. 3,617,287. But in spectral regions where a photoinitiator moderately or weakly absorbs, e.g., in the spectral region overlapping near ultraviolet and visible blue, an additional antihalation agent is needed. Such ultraviolet absorbers, e.g., 2,2'-dihydroxy-4-methoxybenzophenone, disclosed in assignees patent Chu et al., U.S. Pat. No. 3,620,726, however, of necessity tend to tint the photohardenable material being protected.

In contrast to the above-described prior art, the photohardenable composition of the invention is protected against halation without apparently tinting the composition. In preferred embodiments, the ultraviolet absorbers also act as optical brighteners to eliminate tinting due to the other components of the photohardenable material as well. The necessity of a dyed or tinted photohardenable material or a separate antihalation layer is thereby avoided.

SUMMARY OF THE INVENTION

It is an object of this invention to provide improved photosensitive compositions for elements useful in preparing a multicolor, imaged record free from distortion due to antihalation effects and free from discoloration due to element components. It is a further object of this invention to provide such photosensitive elements having thin photohardenable layers which absorb all effective actinic light and which appear to reflect or transmit white light when visually perceived. It is a still further object of this invention to provide improved photosensitive elements for preparing sharp, bright, multicolored pictures having essentially white backgrounds.

Unexpectedly, it has been discovered that substantial amounts of certain ultraviolet absorbing materials can be used as antihalation adjuvants in photohardenable layers to meet the objects of this invention.

An improved photosensitive element of the invention comprises: a support, and at least one photohardenable layer comprising an intimate mixture of: (a) a photohardenable material, (b) a photoinitiator activatable by actinic radiation which is substantially in the near UV wavelength spectral region (i.e, about 325–425 nm), and (c) a sufficient amount of an ultraviolet radiation absorbing material to reduce actinic ultraviolet radiation transmitted by the photohardenable layer by more than about 50 percent, the photohardenable layer visually transmitting or reflecting virtually white light. The initiator is present in an initiating amount.

DESCRIPTION OF THE PREFERRED EMBODIMENTS

The photosensitive compositions of the invention comprise a photohardenable material, a photoinitiator activatable by actinic radiation in the near ultraviolet wavelength spectral region, and an ultraviolet radiation absorbing material which absorbs the radiation by which the photoinitiator is activatable so as to reduce the transmission of said radiation by more than about 50% through a layer of the composition. The UV absorbing material should not tint the composition; and if the composition is discolored due to other components, the ultraviolet radiation absorbing material must brighten the composition so as to render it clear and colorless, whereby the composition will visually transmit or reflect virtually white light.

The compositions of the invention are useful in preparing photosensitive elements with one or more layers preferably having a thickness less than about 0.001 inch. A preferred photosensitive image reproduction element of the invention comprises a support which is transparent to actinic radiation and visible light, and having thereon a substantially solid photohardenable layer. The photohardenable layer is comprised of (a) a free radical initiated, chain propagating, addition polymerizable, ethylenically unsaturated compound, (b) a free radical generating, addition polymerization initiator activatable by near ultraviolet actinic radiation, and (c) at least about 0.5 percent by weight of the layer of an optical brightener which absorbs the near ultraviolet actinic radiation and which is soluble in the layer. A sufficient amount of optical brightener is used to reduce the intensity of actinic light transmitted by the layer to a level which is ineffective in producing further polymerization, particularly upon reflection back through the layer. At the same time, the optical brightener in its normal function whitens or brightens the layer; so that, when laminated to a receptor sheet such as white paper, it visually appears at least as white as the unlaminated receptor sheet. The amount of optical brightener needed to function as an antihalation filter will of course depend on the thickness of the layer, the layer's concentration of other absorbers of actinic radiation, e.g., the photoinitiator, and the brightener's solubility in the layer. However, it is understood that where no optical brightener is necessary, the ultraviolet radiation absorbing material need only function as an antihalation filter, with the proviso that it must not tint the photohardenable material itself. Representative non-tinting ultraviolet absorbers include hydroxy- or alkoxybenzophenones and substituted benzotriazoles, such as 2-hydroxy-4-n-octoxybenzophenone; 2-hydroxy-4-dodecoxybenzophenone; 2,4-dihydroxybenzophenone; 2-hydroxy-4-methoxybenzophenone; 2-hydroxy-4-methoxy-5-sulfobenzophenone trihydrate; 2-hydroxy-4-methoxy-2′-carboxybenzophenone; 2-(2′-hydroxy-5′-methoxyphenyl)-benzotriazole. In addition, ultraviolet absorbing materials which tend to tint the photohardenable layer, e.g., 2,2′-di-hydroxy-4-methoxybenzophenone, may also be used in combination with a brightening amount of a suitable optical brightener. More than one optical brightener may be used if desired. However, when such a mixture of optical brighteners is used, at least one of the optical brighteners, a separate ultraviolet absorbing material, or the mixture as a whole must be used in antihalation quantities indicated herein. The resulting mixture must also be substantially clear and colorless and visually transmit or reflect virtually white light.

Ultraviolet absorbing materials useful in preparing the clear and colorless photohardenable compositions, layers, and elements of this invention absorb actinic ultraviolet radiation so as to reduce transmission of said radiation by more than 50% through a layer of composition. The measurement of reduction in transmission is made by determining the integral of optical density of layers over the 325 – 425 nm spectral region both with and without the UV absorbers added. Layers used for this purpose are preferably no more than 0.001 inch thick. It is further preferred that the UV absorbers be selected to absorb radiation primarily in the region where the photoinitiator or photoinitiating system only moderately or weakly absorbs. In this case, it is also required that the transmission of 325 – 425 nm radiation be reduced by more than 50% if the photoinitiator or photoinitiating system has an absorption maximum at less than 325 nm. Where the maximum is in the 325 – 425 nm region, however, it is required in the preferred case that transmission of radiation between the maximum and 425 nm be reduced by more than 50%. Thus, for purposes of this invention, the area in which the photoinitiator or photoinitiating system moderately or weakly absorbs ultraviolet radiation is defined as 325 – 425 nm or the photoinitiator absorption maximum to 425 nm, as explained above.

In spectral regions where the photoinitiator only moderately or weakly absorbs, actinic light incident at angles other than 90° normally can undergo multiple reflections within the photosensitive layer until absorbed to produce photohardened halation effects. Also, actinic light incident and reflected at 90° can give an apparent increase in photospeed compared to areas where light is not reflected. The ultraviolet absorbing materials preferably luminesce in or near the spectral region where a substantially clear photohardenable element normally weakly absorbs visible light, e. g., in the blue, so that upon irradiation with white light, the combined transmitted (or reflected) light and luminescence visually appears white or is virtually white. The compounds are either dissolved or homogeneously dispersed in the composition or photohardenable layer. Compounds include those soluble in hydrophilic type compositions (e.g., similar to those disclosed in Alles, U.S. Pat. No. 3,475,171) and hydrophobic compositions of Chu et al., U.S. Pat. No. 3,649,268. Finally, the compounds should not adversely affect the photohardenable layer, for example, by markedly reducing the sensitivity of the element or its shelf life or otherwise interfere with the intended use of the element.

Optical brighteners which have been found to be useful in the photohardenable elements of this invention generally are those disclosed in Gurney, U.S. Pat. No. 3,644,394, and Keller et al., U.S. Pat. No. 2,784,183. Optical brighteners which have been found to be particularly useful in hydrophobic type, photohardenable layers of this invention are: 2-(stilbyl-4″)-(naphtho-1′,2′:4,5)-1,2,3-triazole-2″-sulfonic acid phenyl ester hereinafter designated Brightener I and 7-(4′-chloro-6′-diethylamino-1′,3′,5′-triazine-4′-yl)amino3-phenylcoumarin hereinafter designated Brightener II. Optical brighteners which have been found to be particularly useful in hydrophilic type, photohardenable layers of this invention are those disclosed in Scalera et al., U.S. Pat. No. 2,563,493 and more particularly 3,7-di-(2,4-di-methoxybenzoylamino)-dibenzothiophenedioxide-2,8-disodium sulfonate hereinafter designated Brightener III.

The photohardenable element may also have a removable cover sheet on the photohardenable layer, which sheet is less strongly adherent at room temperature to the photohardenable layer than is the base support. In this instance, the cover sheet is removed from the photohardenable element prior to the lamination of the layer or the element to the receptor.

The terms "photopolymerizable" and "photohardenable" as used herein refer to systems in which the molecular weight of at least one component of the photosensitive layer is increased by exposure to actinic radiation sufficiently to result in a change in the rheological and thermal behavior of the exposed areas.

Among suitable photopolymerizable or photohardenable systems are: (1) those in which a photopolymerizable monomer is present alone or in combination with a compatible binder, or (2) those in which the photopolymerizable group is attached to a polymer backbone which becomes activated on exposure to light and may then crosslink by reacting with a similar group or other reactive sites on adjacent polymer chains. In the second group of suitable photopolymerizable systems, where the monomer or pendant photopolymerizable group is capable of addition polymerization, e.g., a vinyl monomer, the photopolymerized chain length may involve addition of many similar units initiated by a single photochemical act. Where only dimerization of similar compounds is involved, e.g., benzophenone or cinnamoyl compounds, the average molecular weight of the photosensitive constituent can be at best only doubled by a single photochemical act. Where a photopolymerizable molecule has more than one reactive site, a crosslinked network can be produced.

The term "underexposed" as used herein is intended to cover the image areas of the photopolymerizable layers which are completely unexposed or those exposed only to the extent that there is polymerizable compound still present in sufficient quantity that the molecular weight remains substantially lower than that of the complementary exposed image areas. The term "stick temperature" as applied to either an underexposed or exposed area of a photopolymerizable stratum means the minimum temperature at which the image area in question sticks or adheres, within 5 seconds, under slight pressure, e.g., thumb pressure, to analytical paper (Schleicher and Schull analytical filter paper No. 595) and remains adhered in a layer of at least detectable thickness after separation of the analytical paper from the stratum.

In a preferred photopolymer image reproduction element, the receptor is a material that adheres strongly to the polymer coating. Almost any material, e.g., paper, polymer, film plastic, metal, ceramic, glass, etc., makes a suitable receptor. The only prerequisites for a receptor are that the anchorage between the receptor and the coating be greater than that between the coating and the base, and that the receptor be stable at the operating temperatures. Polyethylene fulfills the roll of a suitable cover sheet since it shows a weaker adhesion to photopolymer than does polyethylene terephthalate, the base support.

If either a simple monomer or monomer-polymer binder is being used, the element contains a free radical generating, addition polymerization initiator in the photopolymerizable layer. In addition, particularly when a photocrosslinkable polymer or dimer system is used, the layer may also contain a plasticizing agent.

Suitable free radical initiated, chain propagating, addition polymerizable, ethylenically unsaturated compounds for use in the simple monomer or monomer-polymer binder photopolymerizable layers are described in Burg et al. U.S. Pat. No. 3,060,023; Celeste et al. U.S. Pat. No. 3,261,686; and in Assignee's Cohen and Schoenthaler U.S. Pat. 3,380,831, Apr. 30, 1968. Polymers for use in the monomer-polymer binder system and preferred free radical generating addition polymerization initiators are described in U.S. Pat. No. 3,060,023.

Photodimerizable materials useful in the invention are cinnamic acid esters of high molecular weight polyols, polymers having chalcone and benzophenone type groups, and others disclosed in Chapter 4 of "Light-Sensitive Systems" by Jaromir Kosar published by John Wiley & Sons, Inc., New York, 1965. Photopolymerizable materials capable of photocrosslinking with more than one adjacent polymeric chain to form a network are described in J.R. Celeste U.S. Pat. No. 3,469,982, Sept. 30, 1969 and A. C. Schoenthaler, U.S. Pat. No. 3,418,295, Dec. 24, 1968.

Preferred free radical generating addition polymerization initiators, activatable by actinic light, e.g., ultraviolet and visible light, are listed in U.S. Pat. No. 3,060,023 and the other patents referred to above.

Where the polymer is a hard, high melting compound a plasticizer is usually used to lower the glass transition temperature and facilitate selective stripping. The plasticizer may be a monomer itself, e.g., a diacrylate ester, or any of the common plasticizers which are compatible with the polymeric binder. Among the common plasticizers are dialkyl phthalates, polyethylene glycol, and alkyl phosphates.

The base support material may have low oxygen permeability and should be thermally stable in the range of operating temperatures.

The photohardenable layer thickness can vary according to the stratum composition and the material used as receptor. The number of layers of photopolymer in the laminated, product element is dependent upon the image being reproduced, the desired quality of the final product and the uses made of the final product.

The photohardenable layer of the invention, preferably, is capable of being toned with pigments. The various pigments which may be used in the present invention are finely divided powdered materials and are applied by a dusting treatment similar to that disclosed in U.S. Pat. No. 3,060,024, or by transfer as in U.S. Pat. No. 3,060,025. The photohardenable element is imagewise exposed and then dusted with pigment at room temperature or at an elevated temperature if required to produce imagewise tacky areas to which the pigment will adhere. After the excess pigment is dusted off, the layer will bear an image consisting of particles adherent to or embedded in the tacky areas of the layer.

Additionally, other materials beside colorants can be applied to the image-bearing layers, e.g., magnetic materials, electrical or heat-conducting materials, hydrophilic or hydrophobic materials. Dyes may be used as colorants.

The improved photohardenable elements of this invention are particularly useful in imaging processes described in assignee's patents Chu et al., U.S. Pat. No. 3,649,268 and Gray, U.S. Pat. No. 3,639,123. In general, the improved elements of this invention are useful in the process which comprises: (1) laminating a photohardenable element, comprising a photohardenable tacky layer, and a removable support that is transparent to actinic radiation, to a receptor surface, (2) exposing said layer imagewise through said support to actinic radiation to selectively raise the stick temperature of those areas receiving the radiation, to produce nontacky areas, (3) removing said support, and (4) applying colorant material to the exposed layer which adheres only to the underexposed tacky areas of the layer to reveal a colored image. Repeating the laminating, exposing, removing and readout steps in sequence results in a multicolor imaged element. The elements are also useful in other similar photoinduced processes which results on imagewise tacky and nontacky areas.

The exposure of the photopolymerizable element may be through line or halftone positive transparencies. The transparency and the element may or may not be in operative contact, and although exposure may be made through either side in the case of an element that has both support and receptor of a transparent material, in a preferred method the element is exposed through the support side.

Since most of the photohardenable materials preferred in this invention exhibit their maximum sensitivity in the ultraviolet range, the light source should furnish an effective amount of this radiation. Such sources include carbon arcs, mercury-vapor arcs, fluorescent lamps with special ultraviolet-emitting phosphors, argon glow lamps, electronic flash units and photographic flood lamps. The amount of exposure required for satisfactory reproduction of a given element is a function of exposure time, type of light source used, and distance between light source and element.

The invention will be further illustrated by, but is not intended to be limited to, the following detailed examples of various embodiments.

EXAMPLE I

The following solution was prepared:
Solution A

| Solution A | | |
|---|---|---|
| | Methyl methacrylate polymer (low mol. wt., inherent viscosity 0.20, density = 1.13 g/cc) | 200 g |
| | Polyoxyethyltrimethylolpropane triacrylate (avg. mol. wt. 1,000) | 230 g |
| | Polyoxyethylene lauryl ether (M.W. 362) | 30 g |
| | 2-O-Chlorophenyl-4,5-bis(m-methoxyphenyl) imidazolyl dimer | 8 g |
| | 2-Mercaptobenzothiazole | 2 g |
| | Methylene chloride to make | 2000 g |

A portion of solution A was coated on a 0.001-inch-thick polyethylene terephthalate base support at room temperature using a 0.002 inch doctor knife and was allowed to dry at room temperature and designated coating A. The transparent photopolymerizable layer had a slight yellow tint and had a dry thickness of 0.0005 inch.

A second solution, Solution B, was prepared from 1000 g of Solution A and 3 g of Brightener I, 2-(stilbyl-4'')-(naphtho-1':4,5)-1,2,3-triazole-2''sulfonic acid phenyl ester. A third solution, Solution C, was prepared from 500 g of solution A and 0.2 g 2,2' dihydroxy-4-methoxybenzophenone. A fourth solution, Solution D, was prepared from 500 g of Solution B and 0.2 g 2,2' dihydroxy-4-methoxybenzophenone Coatings B, C, and D were prepared from Solutions B, C, and D respectively by the procedure used for preparing Coating A. Coating C was transparent but had a slightly darker yellow tint than Coating A. Both Coating B and D were transparent and appeared visually clear with no yellow tint.

Each of the above coatings was laminated, exposed and toned using the following procedure. A sample of the photopolymerizable coating was laminated at 100°C onto the smooth side of Kromekote cast-coated one-side cover paper, manufactured by The Champion Paper and Fiber Company, using a heated pressure roll. A section of the photopolymerizable surface was covered with a rectangular, opaque mask and the masked, laminated sample was uniformly exposed for 8 seconds using a xenon arc source (a nuArc Plate Maker Model No. FT-26L of the flip-top type, manufactured by the nuArc Co., Inc.) The polyethylene terephthalate film base was removed at room temperature, and a dispersion of 30% Dalamar Yellow (C.I. Pigment Yellow 74) and 70% cellulose acetate was applied to the photopolymer surface. Excess toner was removed with a cotton pad. The pigment adhered only to the rectangular area that was not exposed to light. A second sample of the photopolymerizable coating was laminated at 100°C to the photopolymer surface of the yellow imaged element. A $\sqrt[3]{2}$, neutral density, continuous tone step tablet (30 steps) was situated on the two-layer element so that half of each step covered the yellow pigmented rectangle and the other half of the step covered unpigmented area. The two-layer element in this configuration was exposed using the nuArc plate maker as described above. After stripping off the polyethylene terephthalate, the surface was toned as above with a dispersion of 20% phthalocyanine blue (C.I. Pigment Blue 15) and 80% cellulose acetate. For the case where the photopolymerizable layer absorbs enough actinic light to prevent halation effects the number of the blue step (apparent photospeed) visible in the yellow pigmented half and the unpigmented half will be the same or at least within one step of each other. When the photopolymerizable layer absorbs too little actinic radiation, the unabsorbed radiation will be reflected in the unpigmented region back through the layer and contribute additional polymerization, whereas, in the yellow-pigmented half, the transmitted actinic radiation will be absorbed with no reflection. Consequently the number of the step visible for the unpigmented half will be shifted to higher exposure (apparent photospeed is higher). For elements prepared from Coatings B and D, the number of the stop visible in the pigmented half is virtually the same as for that in the unpigmented half. For the element prepared from Coating A, the number of the step visible for the unpigmented half was shifted 7 steps to higher exposure when compared to the pigmented half. For the element prepared from Coating C, the shift is 6 steps toward higher exposure.

The imaged samples prepared above to demonstrate halation and anti-halation effects were used to illustrate concurrent whitening effects of this invention. Reflection densities of non-image areas of the Kromekote paper samples with the two laminated photopolymer layers were obtained and compared with the reflection densities of Kromekote paper without laminated photopolymer layers. For each sample reflected light passing through a blue filter was measured using a Quanta Log Model RD 100 reflection densitometer, a product of Macbeth Instrument Corporation. Reflection densities to blue light along with the visual color perceived for the two layer element are recorded in Table I for samples prepared from each coating.

TABLE I

| Sample | Visual Color | Blue Density |
|---|---|---|
| Kromekote Paper | White | .08 |
| Coating A | Pale Yellow | .10 |
| Coating B | White | .08–.09 |
| Coating C | Pale Yellow | .10–.11 |
| Coating D | White | .09 |

Although blue density change is slight, 0.02, it results in a visually perceived color change which is distinct.

The optical density of each of the coatings was measured over the wavelength range between 325nM to 425nM using a Cary Recording Spectrophotometer, Model 14, Manufactured by Applied Physics Corporation, using uncoated 0.001 inch polyethylene terephthalate sheet as a reference. Since thickness of the coatings are essentially the same, i.e., 0.0005 inch, the actinic light absorbed by the added optical brightener is essentially the difference in the light transmitted by coating A and coating B or by coating C and coating D. For the purpose of this invention the percent light transmitted by a coating is determined from the average optical density of the coating over the wavelength range of actinic radiation measured. The amount by which transmitted actinic radiation is reduced by Brightener I is determined from the difference in actinic light transmitted by coatings with and without the optical brightener relative to the actinic radiation transmitted by the coating with no optical brightener. Average Optical Density, % transmittance and % by which transmittance is reduced is given in the following table.

TABLE II

| Sample | Optical Density Average | % Transmitted | % Reduced |
|---|---|---|---|
| Coating A | .05 | 89 | — |
| Coating B | .63 | 23 | 74 |
| Coating C | .12 | 76 | — |
| Coating D | .81 | 16 | 79 |

Yellow tinted coating A and C are substantially transparent to actinic radiation and produce halation effects as indicated by the corresponding imaged element whereas addition of optical brighteners in substantial amounts as in coatings B and D reduces transmitted actinic radiation by more than 50 % thereby eliminating the halation effects, and brightens the film.

EXAMPLE II

The following solution was prepared:

| | |
|---|---|
| Methyl methacrylate polymer (very high M.W. density 1.20 g/cc) | 100 g |
| Trimethylolpropane trimethacrylate | 84 g |
| Tetrahydrofurfuryl methacrylate | 20 g |
| 2-0-Chlorophenyl-4,5-bis(m-methoxyphenyl) imidazoly dimer | 4 g |
| 1-phenyl-2-tetrazoline-5-thione | 1.5 g |
| Tricresyl phosphate | 61 g |
| Brightener I | 3 g |
| 2,2'dihydroxy-4-methoxy benzophenone | 0.2 g |
| Methylene chloride to make | 1000 g |

The solution was coated as in Example I to give a dry thickness of about 0.0005 in. As in Example I the coating was laminated to Kromekote paper, exposed and toned. The nonimaged areas of the exposed, laminated element were as white as the paper itself and the number of blue toned steps over the yellow pigmented half was essentially the same as the number over the unpigmented half, indicating adequate antihalation protection.

EXAMPLE III

The following solution was prepared:
Solution E

| | |
|---|---|
| Solution E | |
| Methyl methacrylate polymer (very high M.W., inherent viscosity 1.2; density 1.20 g/cc) | 82 g |
| Vinyl acetate polymer (moderate M.W., density 1.19 g/cc) | 32 g |
| Polyoxyethyl trimethylolpropane triacrylate (ave. M.W., 1,000) | 115 g |
| 2-0-chlorophenyl-4,5-bis(m-methoxyphenyl) imidazolyl dimer | 4 g |
| 2-Mercaptobenzothiazole | 1.5 g |
| Methylene chloride to make | 1000 g |

Three additional solutions, Solution F, Solution G and Solution H were prepared by dissolving, respectively, 0.3 g, 0.625 g and 1.0 g of Brightener II, 7-(4'-chloro-6'-diethylamino-1',3',5'-triazine-4'-yl)amino-3-phenylcoumarin, in 250 g of Solution E. A portion of each solution was coated as in Example I to give a dry coating thickness of 0.0005 inches. As in Example I the optical density to actinic light for each coating was obtained and antihalation effects were determined from imaged, laminated Kromekote elements. The following table contains the visually perceived color of non-image background areas of the element (compared to Kromekote paper), the shift in exposure, i.e., number of steps, due to halation effects, the average optical density (325nM to 425nM) and the percent reduction to actinic light transmitted by each coating

TABLE III

| Sample | Visual Color | Step Difference | OD(Average) | % Reduced |
|---|---|---|---|---|
| Kromekote Paper | White | — | — | — |
| Coating E | Pale Yellow | 6 – 7 | 0.16 | — |
| Coating F | Luminescent White | ½ | 0.50 | 54 |
| Coating G | do. | 0 | 0.80 | 77 |
| Coating H | do. | 0 | 1.16 | 90 |

Coatings F through H demonstrate a useful range in which Brightener II functions both as a whitener and an antihalation agent.

EXAMPLE IV

| | |
|---|---|
| The following solution was prepared: | |
| Vinylchloride/vinylacetate copolymer (density 1.35 g/cc, inherent viscosity 0.54) | 100 g |
| Trimethylolpropane trimethacrylate | 80 g |
| Polyoxyethyl trimethylolpropane triacrylate (Average M.W. 1,000) | 20 g |
| 2-0-Chlorophenyl-4,5-bis(m-methoxyphenyl) imidazolyl dimer | 4 g |
| 2-Mercaptobenzothiazole | 1.5 g |
| Polyethyleneoxide lauryl ether (M.W. 362) | 25 g |
| Methylene chloride to make | 1000 g |

A second solution was prepared by dissolving 0.25 g of Brightener I and 1.25 g of Brightener II in 500 g of the above solution. Each solution was coated on a 0.001 inch polypropylene film support using a 0.004 inch doctor knife and was allowed to dry at room temperature to give a dry coating thickness of 0.001 inch. The coating prepared from the first solution had a slight yellow tint and the coating prepared from the second coating containing the two optical brighteners, appeared visually clear with no yellow tint. The average optical density of the first coating, determined as in Example I, was 0.374 and the average optical density of the second coating was 1.52. By adding the optical brighteners, the transmitted actinic light normally transmitted by the coating containing no brightener is reduced by 93%.

Each of the coatings was tested for antihalation effects using imaged, laminated elements as in Example I. The element prepared from the first coating had a shift in the unpigmented half, i.e., a step-shift, to higher exposures of 4 steps. The element prepared from the second coating had no such step-shift indicating complete antihalation protection. Untoned areas of the second element appeared at least as white as the Kromekote cast-coated one-side cover paper from which the element was prepared.

EXAMPLE V

The following solution was prepared:

| | |
|---|---|
| Pentaerythritol triacrylate | 50 g |
| Poly(methyl methacrylate/methacrylic acid) (90/10 mole ratio, intrinsic viscosity 0.094) | 50 g |
| Triethylene glycol diacetate | 13 g |
| 2-0-Chlorophenyl-4,5-bis(m-methoxyphenyl) imidazolyl dimer | 2 g |
| 2-Mercaptobenzothiazole | 1 g |
| 2-ethoxyethanol to make | 500 g |

A second solution was prepared by dissolving 0.3 g of Brightener III, 3,7-di-(2,4-dimethoxybenzoylamino)-dibenzothiophenedioxide-2,8-disodium sulfonate, in 250 g of the above solution. Each solution was coated as in Example I to give a dry thickness of 0.0005. Each coating was laminated to a plate of nontreated, brush-grained aluminum. Each laminated element was masked as in Example I and exposed uniformly on a nuArc Plate Maker for 15 seconds. The polyester support was removed, and powdered Latyl Yellow (C.I. Disperse Yellow 42) dye was applied to the surface and the element heated to 80°C for 3.5 minutes. Excess dye was brushed off and a second coating of the same material was laminated to the imaged surface and exposed through a step tablet as in Example I. The polyester support was removed and the surface treated as above with powdered Latyl cerise dye (CI Disperse Red 55:1).

The imaged element prepared from the first solution had a pale yellow background and the undyed half of the step image was shifted toward higher exposure. The imaged element prepared from the second solution had a bright background and there was no apparent step-shift in the step image.

EXAMPLE VI

A solution prepared as in Example II was coated onto a 0.001 inch film base of polyethylene terephthalate at a coating speed of 6 ft./min.

The coating was allowed to dry at 55°C. A 0.001 inch cover sheet of polyethylene was laminated onto the coating at room temperature, at a pressure of 22 lbs. (translatable into nip force by known mathematical methods).

Blue Printer Positive

The cover sheet was stripped at room temperature from the coating, and the photopolymerizable layer was laminated at 100°C. onto the smooth side of "Kromekote" cast-coated one-side cover paper, as in Example I.

The photopolymer was exposed through the blue printer separation halftone positive for 8 sec. using the nuArc Plate Maker. The polyethylene terephthalate film base was removed at room temperature, and Primrose Yellow toner (C.I. Pigment Yellow 34) was applied to the photopolymer surface. Excess toner was removed with a cotton pad. The pigment adhered only to those areas that were not exposed to light.

Green Printer Positive

The polyethylene cover sheet was removed from a second element coated with the solution of Example II and the clear photopolymer was laminated onto the blue printer photopolymerized layer, obtained above, at a temperature of 100°C. The 2-layer film base was exposed through the green printer separation halftone positive for 8 seconds using the nuArc light source. The base support was stripped from the photopolymer, and a magenta toner, a dispersion consisting of 50% quinacridone magenta (C.I. Pigment Red 122) and 50% cellulose acetate, was applied to the exposed surface at room temperature. The excess toner was dusted off with a cotton pad, the pigment adhering to the underexposed areas only.

Red Printer Positive

After removal of the polyethylene cover sheet from a third photopolymerizable layer prepared as above, the latter layer was laminated onto the green printer photopolymerized layer. This was exposed through the red printer halftone positive for 8 sec. using the nuArc light source. The polyethylene terephthalate was removed from the red printer layer, and a phthalocyanine blue toner, a dispersion of 50% phthalocyanine blue (C.I. Pigment Blue 15) and 50% cellulose acetate was dusted onto the exposed surface at room temperature. The excess toner was removed with a cotton pad, leaving pigment in the underexposed areas only.

Black Printer Positive

A fourth photopolymerizable layer was laminated onto the red printer layer of the 3-layer film base using the same procedure and under the same experimental conditions used in preparing the two previous layers. The fourth layer was exposed through the black printer halftone positive for 8 sec. using the nuArc light source. After stripping off the polyethylene terephthalate, a carbon black toner (C.I. Pigment Black 7) predispersed in pentaerythritol resin was applied to the exposed surface at room temperature. The excess pigment was dusted off with a cotton pad, leaving pigment in the underexposed areas only.

A good quality, 4-color halftone print was obtained having a clean white background and having no defects due to halation effects.

EXAMPLE VII

A solution similar to Solution B in Example I was prepared using a concentration of Brightener I of about 0.2%, based on solids. The solution was coated on a base support and produced a coating having an OD average of 0.18. The actinic radiation transmitted, using the procedure of Example I, was reduced by only 26% when compared to the coating without Brightener I. When the coating was laminated and imaged as in Example I, the non-pigmented half was shifted 4 steps to higher exposures, indicating significant halation effects.

Example III was also repeated using a reduced brightener concentration of 0.2%, based on solids, of Brightener II. Transmitted actinic radiation was reduced by only 20% and the non-pigmented half of the imaged element was shifted 3 to 4 steps toward higher exposure, indicating halation effects.

It is, therefore, evident that a sufficient amount of UV absorber must be used in order to obtain the antihalation effects of the invention.

I claim:

1. A substantially clear and colorless photosensitive composition comprising (a) a photohardenable material having ethylenically unsaturated or benzophenone type groups, (b) a photoinitiator activatable by actinic radiation in the rear ultraviolet wavelength spectral region, and (c) a sufficient amount of an ultraviolet radiation absorbing material, which absorbs the radiation, to reduce ultraviolet actinic radiation transmitted by a layer no more than 0.001 inch thick of the photohardenable composition by more than about 50 percent, the photohardenable layer visually transmitting or reflecting virtually white light.

2. A photosensitive composition of claim 1 wherein said ultraviolet radiation absorbing material reduces ultraviolet actinic radiation transmitted by a layer of said composition by more than about 50 percent in the spectral region where said photoinitiator moderately or weakly absorbs ultraviolet radiation.

3. A photosensitive composition according to claim 1 wherein said ultraviolet radiation absorbing material is comprised of at least one optical brightener.

4. A photosensitive composition according to claim 2 wherein said ultraviolet radiation absorbing material is comprised of at least one optical brightener.

5. A photosensitive composition according to claim 4 wherein said optical brightener is present in an amount of at least 0.5 percent by weight of the composition and is selected from 2-(stilbyl-4'')-(naphtho-1',2':4,5)-1,2,3-triazole-2''-sulfonic acid phenyl ester, 7-(4'-chloro-6'-diethylamino-1',3',5'-triazine-4'-yl)amino-3-phenylcoumarin, and 3,7-di-(2,4-dimethoxybenzoylamino)-dibenzothiophenedioxide-2,8-disodium sulfonate.

6. A photosensitive composition according to claim 1 wherein said ultraviolet radiation absorbing material is comprised of at least one ultraviolet radiation absorbing compound and at least one optical brightener.

7. A photosensitive composition according to claim 2 wherein said ultraviolet radiation absorbing material is comprised of at least one ultraviolet radiation absorbing compound and at least one optical brightener.

8. A photosensitive composition according to claim 6 wherein said ultraviolet radiation absorbing compound is 2,2'-dihydroxy-4-methoxybenzophenone and said optical brightener is 2-(stilbyl-4'')-(naphtho-1',2':4,5)-1,2,3-triazole.

9. A photosensitive composition according to claim 7 wherein said ultraviolet radiation absorbing compound is 2,2'-dihydroxy-4-methoxybenzophenone and said optical brightener is 2-(stilbyl-4'')-(naphtho-1',2':4,5)-1,2,3-triazole.

10. A photosensitive composition according to claim 1 wherein said ultraviolet radiation absorbing material is a compound selected from hydroxy- or alkoxybenzophenones and substituted benzotriazoles.

11. A photosensitive composition according to claim 1 wherein a polymeric binder is additionally present.

12. A photosensitive composition according to claim 1 wherein said photohardenable material is a free-radical initiated, chain propagating, addition polymerizable, ethylenically unsaturated compound and said photoinitiator is a free-radical generating addition polymerization initiator.

13. A photosensitive element comprising a support having a layer of the composition of claim 1.

14. A photosensitive element comprising a support having a layer of the composition of claim 2.

15. A photosensitive element comprising paper or polymeric film coated with a layer of the composition of claim 4, said layer having a thickness of less than 0.001 inch and being capable of being toned with finely divided powdered material.

16. A photosensitive element of claim 15 wherein said photohardenable material is a free-radical initiated, chain propagating, addition polymerizable, ethylenically unsaturated compound; said photoinitiator is a free-radical generating addition polymerization initiator and said optical brightener is present in an amount of at least 0.5 percent by weight of the composition and is selected from 2-(stilbyl-4'')-(naphtho-1',2':4,5)-1,2,3-triazole-2''-sulfonic acid phenyl ester, 7-(4'-chloro-6'-diethylamino-1', 3',5'-triazine-4'-yl)amino-3-phenylcoumarin, and 3,7-di-(2, 4-dimethoxybenzoylamino)-dibenzothiophenedioxide-2,8-disodium sulfonate.

17. A photosensitive element according to claim 14 wherein said support is transparent and said layer has a cover sheet which is less adherent to said layer at room temperature than said support.

18. A layer of imagewise exposed photohardenable material of claim 1 having tacky and non-tacky areas, said tacky areas having finely divided powdered material adhered thereto.

19. A multicolor imaged element comprising a plurality of laminated, imaged and toned layers of claim 18.

* * * * *